(12) United States Patent
Lopez et al.

(10) Patent No.: US 6,937,102 B2
(45) Date of Patent: Aug. 30, 2005

(54) LOW BIAS CURRENT/TEMPERATURE COMPENSATION CURRENT MIRROR FOR LINEAR POWER AMPLIFIER

(75) Inventors: Osvaldo Jorge Lopez, Lebanon, NJ (US); Robert Bayruns, Los Gatos, CA (US); Mahendra Singh, Bridgewater, NJ (US)

(73) Assignee: Anadigics, Inc., Warren, NJ (US)

( * ) Notice: Subject to any disclaimer, the term of this patent is extended or adjusted under 35 U.S.C. 154(b) by 354 days.

(21) Appl. No.: 10/208,636

(22) Filed: Jul. 29, 2002

(65) Prior Publication Data

US 2003/0006845 A1 Jan. 9, 2003

Related U.S. Application Data

(63) Continuation of application No. 09/634,628, filed on Aug. 8, 2000.
(60) Provisional application No. 60/148,099, filed on Aug. 10, 1999.

(51) Int. Cl.[7] .................................................. H03F 3/04
(52) U.S. Cl. ........................................ 330/296; 330/285
(58) Field of Search ................................ 330/129, 130, 330/136, 285, 288, 289, 296, 291

(56) References Cited

U.S. PATENT DOCUMENTS

| | | | |
|---|---|---|---|
| 3,984,783 A | 10/1976 | Bickley | 330/40 |
| 4,077,013 A | 2/1978 | Morez et al. | 330/269 |
| 4,317,083 A | 2/1982 | Boyd | 330/296 |
| 4,340,867 A | 7/1982 | Sano | 330/40 |
| 4,924,194 A | 5/1990 | Opas et al. | 339/389 |
| 4,956,567 A | 9/1990 | Hunley et al. | 307/310 |
| 5,136,257 A | 8/1992 | Reading | 330/189 |
| 5,311,143 A | 5/1994 | Soliday | 330/127 |
| 5,442,321 A | 8/1995 | Bayruns et al. | 330/282 |
| 5,602,510 A | 2/1997 | Bayruns et al. | 330/282 |
| 5,646,573 A | 7/1997 | Bayruns et al. | 330/59 |
| 5,757,236 A | 5/1998 | Ortiz et al. | 330/296 |
| 5,774,017 A | 6/1998 | Adar et al. | 330/126 |
| 5,892,400 A | 4/1999 | van Saders et al. | 330/277 |
| 5,923,215 A | 7/1999 | Hans | 330/132 |
| 5,942,946 A | 8/1999 | Su et al. | 330/285 |
| 5,952,860 A | 9/1999 | van Saders et al. | 327/219 |
| 5,982,236 A | 11/1999 | Ishikawa et al. | 330/296 |
| 6,020,787 A * | 2/2000 | Kim et al. | 330/284 |
| 6,194,968 B1 | 2/2001 | Winslow | 330/289 |
| 6,201,440 B1 * | 3/2001 | Kobayashi | 330/133 |
| 6,204,731 B1 | 3/2001 | Jiang et al. | 330/124 |
| 6,242,986 B1 | 6/2001 | Adar | 330/302 |
| 6,314,008 B1 | 11/2001 | Bao et al. | 363/44 |
| 2001/0011926 A1 | 8/2001 | Adar | 330/126 |

OTHER PUBLICATIONS

U.S. Appl. No. 09/875,117, filed Jun. 6, 2001, Liwinski.
U.S. Appl. No. 09/668,181, filed Sep. 22, 2000, van Saders et al.
Sato et al., "Intelligent RF Power Module Using Automatic Bias Control (ABC) System for PCS CDMA Application" IEEE MTT–S International Microwave Symposium Digest, Jun. 1998.

* cited by examiner

Primary Examiner—Robert Pascal
Assistant Examiner—Khanh Van Nguyen
(74) Attorney, Agent, or Firm—Morgan Lewis & Bockius LLP (57) ABSTRACT

A power amplifier circuit whose performance is optimized by operating its stages in substantially close to a Class B mode by reducing quiescent current during low driver signal levels. As the driver signal amplitude increases, the operation of the amplifier is configured to dynamically adjust to be in a Class AB mode, thereby increasing the power efficiency of the overall circuit at kiw drive levels. A further enhancement to the power amplifier circuit includes a temperature compensation circuit to adjust the bias of the amplifier so as to stabilize the performance in a wide temperature range.

16 Claims, 5 Drawing Sheets

LOW BIAS CURRENT/TEMPERATURE COMPENSATION CURRENT MIRROR FOR LINEAR POWER AMPLIFIER

CROSS REFERENCE TO RELATED APPLICATIONS

This is a continuation of application Ser. No. 09/634,628, filed Aug. 8, 2000, that claims the benefit of U.S. Provisional Application No. 60/148,099, filed Aug. 10, 1999.

FIELD OF THE INVENTION

This invention relates to amplifier circuitry and, more particularly, to a low bias current and temperature compensation current mirror for use in a linear power amplifier.

BACKGROUND OF THE INVENTION

Power amplifiers are categorized into several classes of operation. Some of these classes include Class-A, Class-B and Class-AB. A Class A power amplifier is defined as an amplifier with or without negative feedback, and in its ideal case is characterized with the greatest fidelity in faithfully amplifying an input signal with the least distortion. It conducts output current throughout 100% of the input signal waveform. In other words it exhibits a conduction angle of exactly $2\pi$ radians. In most cases it exhibits the greatest gain of all power amplifier classes. Another characteristic of the Class A amplifier is that its DC bias point is generally selected to be at ½ the transistor's peak current capability and ½ its peak voltage capability. It is however the least efficient of all the classes of amplifiers, in as much that in ideal cases the power delivered to the load is typically only 50% of the D.C. power used.

A Class AB amplifier is defined in the ideal case as a power amplifier that has an output current flow for more than half, but less than all, of the input cycle. In other words it exhibits a conduction angle between $\pi$ and $2\pi$ radians. See, e.g., Gilbilisco, Stan, Ed. Amateur Radio Encyclopedia, TAB Books, 1994. Another characteristic of a Class AB amplifier is that it is generally biased at less than ½ of the transistor's peak current capability. The advantages of a Class AB amplifier include improved high power efficiency over a Class A type amplifier and improved efficiency at low drive levels. The drawbacks of Class AB power amplifiers include the generation of an output signal which is not an exact linear reproduction of the input waveform, lower gain than that of a Class A type, continuous current drain, and lower efficiency compared to other amplifier types.

An ideal Class B amplifier is defined as an amplifier that has output current flow for ½ the cycle of the input signal wave form. In other words it exhibits a conduction angle of $\pi$ radians. The advantages of a Class B amplifier are improved high power efficiency over Class A and AB type amplifiers and improved efficiency at low drive levels. The drawbacks of a Class B amplifier include even higher distortion and lower gain compared to Class A and AB amplifiers.

Class A, AB and B amplifiers are typically used in the transmitters of cellular mobile terminals. The Class selected is often dictated by the communications standard employed by the terminal. Typically a GSM type handset will utilize a Class B amplifier stage as the final amplifier of the transmitter. This is because the GMSK standard employed in a GSM handset embeds the voice or data being transmitted in the phase angle of the signal, which is sometimes referred to as a constant envelope signal. Such signals are more tolerant to amplitude distortion during the amplification and transmission process. One benefit of using a Class B amplifier in these handsets is that it results in longer battery life and thus longer talk times.

In an NADC or CDMA cellular mobile terminal the final amplifier in the transmitter chain is typically a Class AB type amplifier. This is because the data or voice being transmitted is encoded in both the amplitude and phase of the signal. This results in a signal with a non-constant envelope, requiring a transmitter having a minimal amount of both amplitude and phase distortion.

Although Class AB operation improves power efficiency at the cost of some linearity of signal amplification, it has become the amplifier class of choice for non-constant envelope mobile cellular and PCS transmitters. Unlike the Class B type amplifier, the Class AB requires a quiescent current bias. And although it exhibits better efficiency at low drive levels than a Class A type amplifier, the optimum low drive efficiency is limited by the linearity requirement under higher drive. In general, as power efficiency improves under high drive, linearity will suffer. The inverse relationship of efficiency at high drive, low quiescent bias, high efficiency at low drive and the need for high drive linearity makes the selection of a quiescent bias point a critical design parameter. The operation of the Bipolar or FET transistors at low quiescent bias points also exposes the amplifier to greater variability in performance at both low and high operating temperatures.

Ideally, a power amplifier for use in mobile terminal equipment such as cellular or PCS communication devices employing a non-constant envelope modulation scheme should amplify the input signal linearly with minimal distortion of the signal and with optimum efficiency across a wide range of drive levels.

In practice, balancing linearity and efficiency across all drive conditions is difficult. Accordingly, a need exists for an improved biasing arrangement that dynamically adjusts the operating mode of the power amplifier as a function of drive signal, temperature or other relevant factors. Such a biasing arrangement would both eliminate excessive power dissipation in the output stages at low drive levels and minimize distortion over a broad range of drive levels.

SUMMARY OF THE INVENTION

In one aspect, the present invention comprises an amplifier biasing circuit. The biasing circuit is configured to set a bias point to operate the amplifier in a deep Class AB mode or an almost Class B mode (i.e., a mode substantially close to a Class B mode) during low drive level (quiescent current) conditions. The depth of the Class AB mode is bounded by the worst case allowable distortion at those drive levels. When the drive level increases, the biasing circuit dynamically adjusts the bias point in such a manner that the amplifier operates in a Class AB mode and allows the amplifier to accommodate high drive levels, again bounded by the worst case allowable distortion. Other parameters may be used alternatively or in addition to drive level to adjust the amplification mode. For example, distortion levels may be detected, by means that would be apparent to those of ordinary skill in this field, and may be used to adjust the bias point or other parameters in order to dynamically modify the amplification mode.

In another aspect, the present invention comprises a circuit to achieve temperature compensation. The temperature compensation circuit is configured to adjust the bias point of the amplifier over a temperature range. In a yet another aspect, the invention is directed to a monolithic integrated circuit comprising the biasing circuit.

In a further aspect, the invention is a method of dynamically adjusting the bias points of a multi-stage amplifying circuit, comprising the steps of detecting the drive level at a driver stage of the amplifying circuit and dynamically adjusting the bias points of a single stage or all of the stages of the entire multi-stage amplifying circuit.

BRIEF DESCRIPTION OF THE DRAWINGS

These and other objects, features and advantages of the present invention will be more readily apparent from the following detailed description of the preferred embodiments, where like numerals designate like parts, in which.

DETAILED DESCRIPTION OF THE PREFERRED EMBODIMENTS

Figure 1:
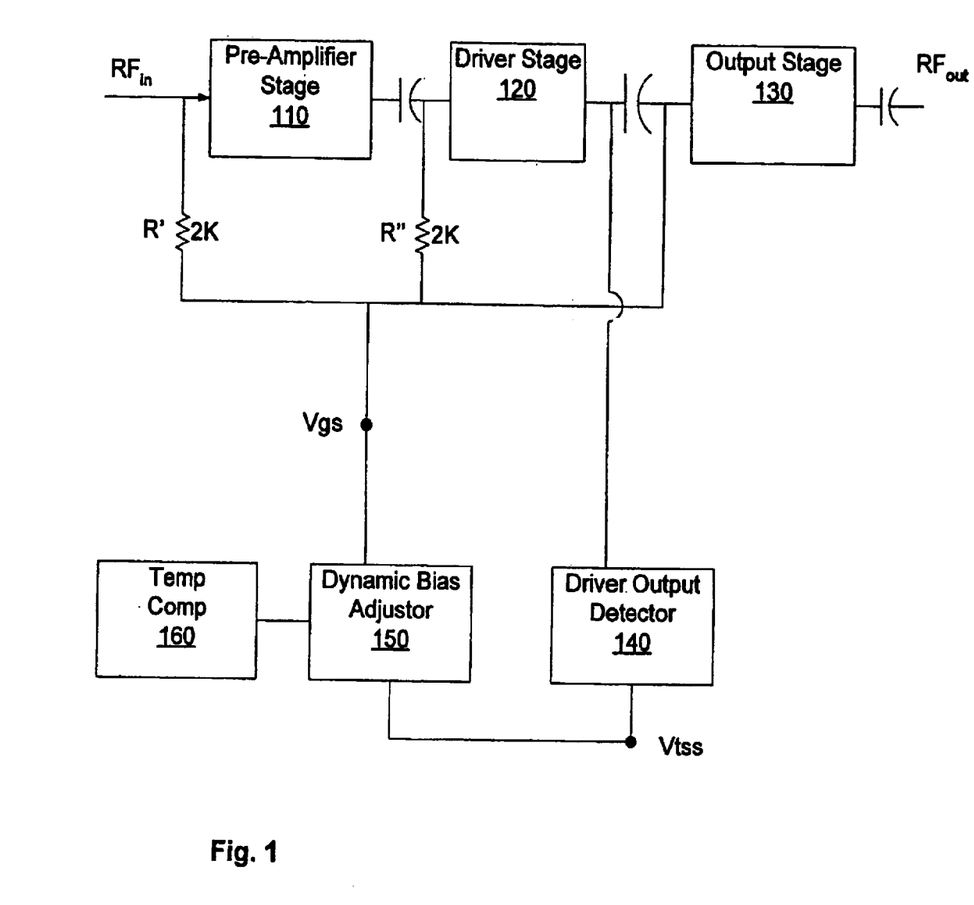
FIG. 1 is a block schematic of a preferred embodiment of the present invention.

FIG. 1 illustrates a linear power amplifier including the novel dynamic bias features of the present invention. The amplifier includes a pre-amplifier stage 110, a driver amplifier stage 120, and an output amplifier stage 130. In a preferred embodiment, the output of the driver amplifier stage 120 is coupled to a driver output detector 140. A bias adjustor circuit 150 in accordance with the present invention is coupled to the driver ouptut detector 140. Additionally, the output of the bias adjustor circuit 150 is coupled to the three-stage amplifier circuit via a coupling circuit comprising resistors R' and R". Preferably resistors R' and R" are each 2KΩ. Temperature compensation circuit 160 is coupled to the bias adjustor circuit 150.

Each of the three stages 110, 120, 130 is preferably comprised of a depletion mode Gallium Arsenide (GaAs) Field Effect Transistor (FET) gain amplifier. In general, the depletion mode FET current characteristics are such that it draws maximum current ($I_{dss}$) when its gate-to-source voltage ($V_{gs}$) is zero, and minimum current (zero) when its gate-to-source voltage is negative Vp. The various modes of operation, i.e., Class A, Class B and Class AB, are achieved by applying a suitable amount of gate-to-source voltage. Thus, the modes of operation can be defined by the percentage of the maximum current drawn at each stage.

In a preferred embodiment, the pre-amplifier stage 110 is designed to operate in a Class A mode and primarily functions as a gain stage. The driver amplifier 120 is configured to operate in a Class AB mode. The output amplifier 130 is configured to operate in a Class AB mode or substantially close to a Class B mode.

Figure 2:
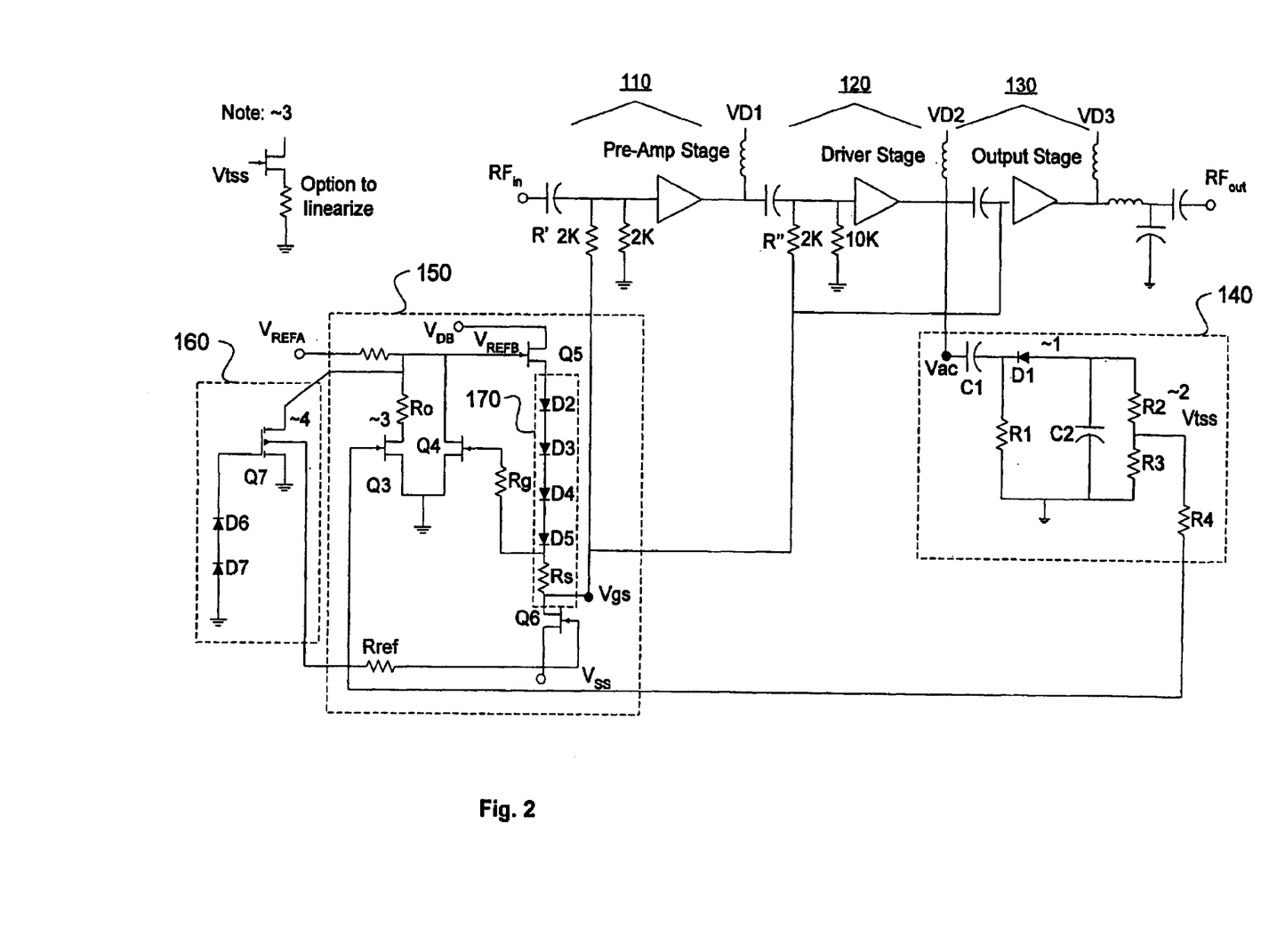
FIG. 2 is a detailed schematic of a preferred embodiment of the present invention.

Referring now to FIG. 2, in a preferred embodiment, the driver output detector circuit 140 comprises diode D1, resistor R1, capacitor C1, filter capacitor C2 and resistive divider comprising resistors R2 and R3.

The dynamic bias adjustor circuit 150 preferably comprises a pair of Field Effect Transistors (FET) Q3 and Q4 considered a reference Field Effect Transistor. Q3 is biascoupled to the driver output detector circuit 140. The drain of Q3 is preferably coupled to a current limiting resistor $R_o$. In one embodiment, the source of Q3 is coupled to ground. In an alternative embodiment, the source of Q3 is coupled to ground via a resistor of suitable size.

A source-follower circuit, preferably comprising FET Q5 is coupled to both Q3 and Q4 (the reference FET). The source follower is provided with a reference voltage, $V_{refB}$, applied at the gate of Q5. A plurality of diodes and resistors form a level-shifting circuit 170. In a preferred embodiment, four diodes D2, D3, D4, D5 and resistor Rs form a level-shifting circuit 170 to produce a combined voltage level drop of about 2.6V. A FET Q6 with its gate and source tied together acts as a current source establishing the current through diodes D2, D3, D4 and D5. It is operatively coupled to the level-shifting circuit 170 as shown.

The temperature compensation circuit 160 preferably comprises an FET Q7 and a plurality of diodes connected to its gate. In a preferred embodiment, two diodes, D6 and D7 are used.

Operation of the Circuit

One aspect of the present invention is that a master-slave relationship is established between the driver stage 120 and the output stage 130 of the multi-stage power amplifier of FIG. 1. As the driver stage 120 detects a need to generate a larger AC output voltage, it instructs itself and the other stages in the power amplifier to alter their operating modes from a deep Class AB or B mode to a Class AB mode. Thus, the multi-stage power amplifier dynamically adjusts its bias point to deliver optimum efficiency across a broad range of drive level conditions. It has been found that this approach additionally reduces the required idle (quiescent) current by about 60%. Further, this invention minimizes or extends the gain compression characteristics typically exhibited by fixed Class AB or Class B mode power amplifiers. Moreover, the present invention controls and stabilizes the bias point of a multi-stage power amplifier over a wide temperature range of $-30°$ C. to $+110°$ C.

Figure 3A:
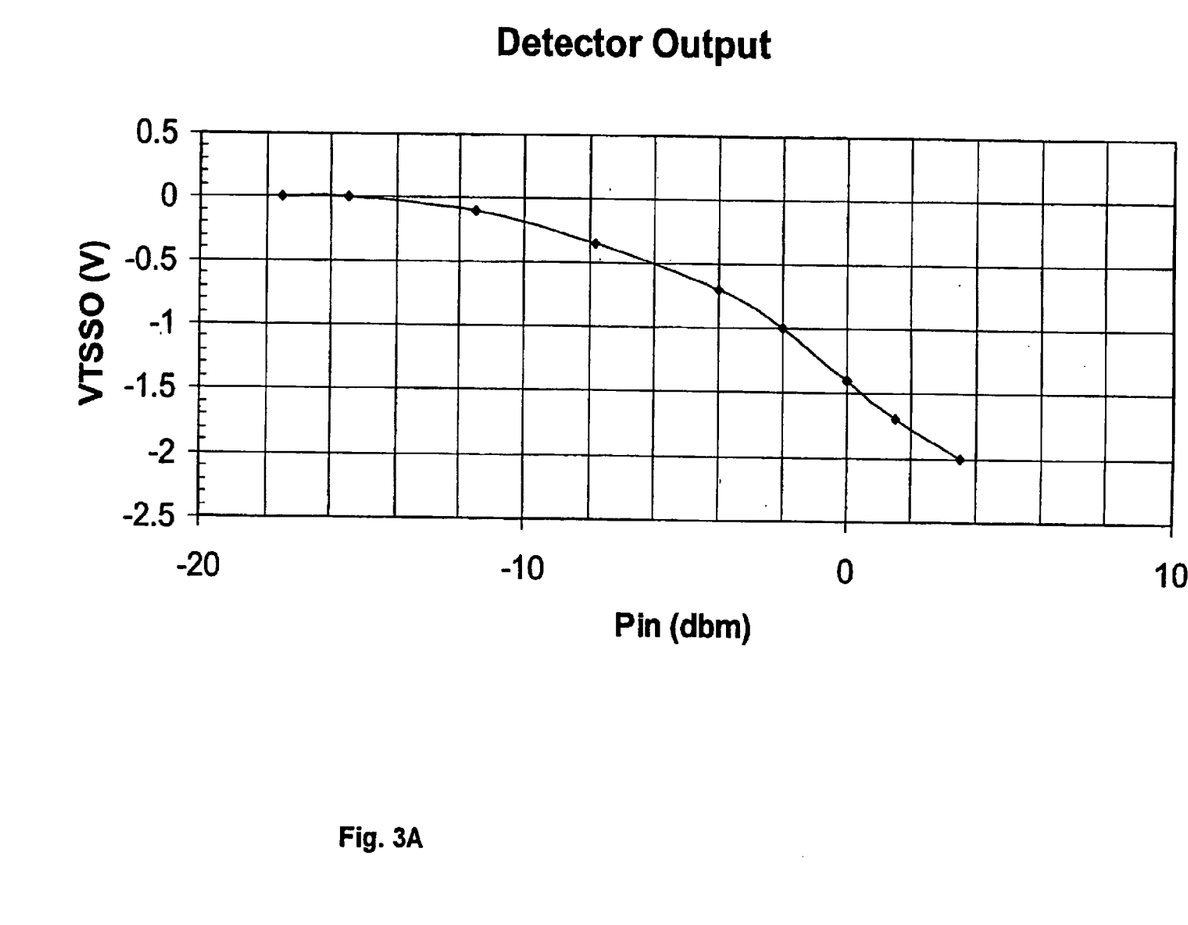
FIG. 3A shows the characteristics of the $V_{tss}$ versus peak AC swing.

The driver output detector circuit 140 detects the alternating voltage (AC) signal swing at the driver output and generates a negative Direct Current (DC) voltage proportional to the peak AC swing $V_{ac}$ (i.e., the voltage range from peak-to-peak). The capacitor C1 filters out the fundamental frequency component of $V_{ac}$ and the resistive divider comprising resistors R2 and R3 determines the slope of the relationship between the peak AC voltage $V_{ac}$ and the DC output voltage ($V_{tss}$), as well as the maximum value that $V_{tss}$ can reach. FIG. 3A shows the characteristics of the $V_{tss}$ versus peak AC power ($P_{in}$).

The voltage $V_{tss}$ obtained at the driver output detector is applied to the gate of Q3. This gate voltage controls current $I_l$ through Resistor $R_o$. Change in the current $I_l$ results in a change in the voltage $V_{refB}$ applied at the source follower Q5. The output of the source follower Q5 is level-shifted by the level-shifting circuit 170 to the appropriate gate-to-source voltage $V_{gs}$. $V_{gs}$ is used to set the operating mode of the three stages 110, 120 and 130 of the power amplifier.

At no drive or very low drive level conditions at the input of the pre-amplifier stage 110, the peak AC signal at the output of the driver stage 120 is very small or zero. Therefore, voltage $V_{tss}$ is also very small or zero. This voltage, $V_{tss}$, is applied to the gate of the transistor Q3. This forces Q3 to draw a maximum current, causing the voltage $V_{refB}$ to drop. The drop in $V_{refB}$ forces the gate-to-source voltage, $V_{gs}$, for all the stages, to become more negative, thereby making them draw less current. This pushes the operating mode of the output stage of the power amplifier towards a Class B or substantially close to a Class B mode. Operating each power amplifier stage at low currents increases the power-added efficiency of the amplifier and reduces the overall DC operating current at very low drive levels.

As the drive level to the pre-amplifier stage 110 increases, the driver's peak AC output voltage $V_{ac}$ increases. When the peak AC output voltage $V_{ac}$ exceeds approximately 0.65 V (which is the forward bias voltage drop for a Gallium Arsenide diode), the driver output detector 140 will begin to generate a negative voltage proportional to the peak AC output voltage. As the drive is increased, this voltage becomes more and more negative and approaches the maximum level of DC voltage, which is determined by the resistor R2. As $V_{tss}$ increases, the transistor Q3 draws less current, causing an increase in the voltage $V_{refB}$. This increase in voltage in turn increases the voltage Vgs, thereby shifting the bias point of the amplifier stages toward a Class AB mode. Thus, an efficient operation with minimal spectral distortion is achieved under large signal conditions.

A further feature of the circuit presented here is temperature compensation circuit 160. The plurality of diodes D6 and D7 are configured to bias the transistor Q7 close to pinch off (Vp), i.e., the point at which Q7 permits current flow. A negative voltage, supplied by a series resistor Rref connected to Vss is also used to bias the transistor Q7. The operating point of transistor Q7 is similar to that of the output stage 130 of the amplifier. Diodes D6 and D7 are selected such that they establish the required rate of change in the voltage drop across them versus temperature. Transistor Q7 and resistor Rref are selected such that the required slope in temperature compensation is achieved.

Figure 3B:
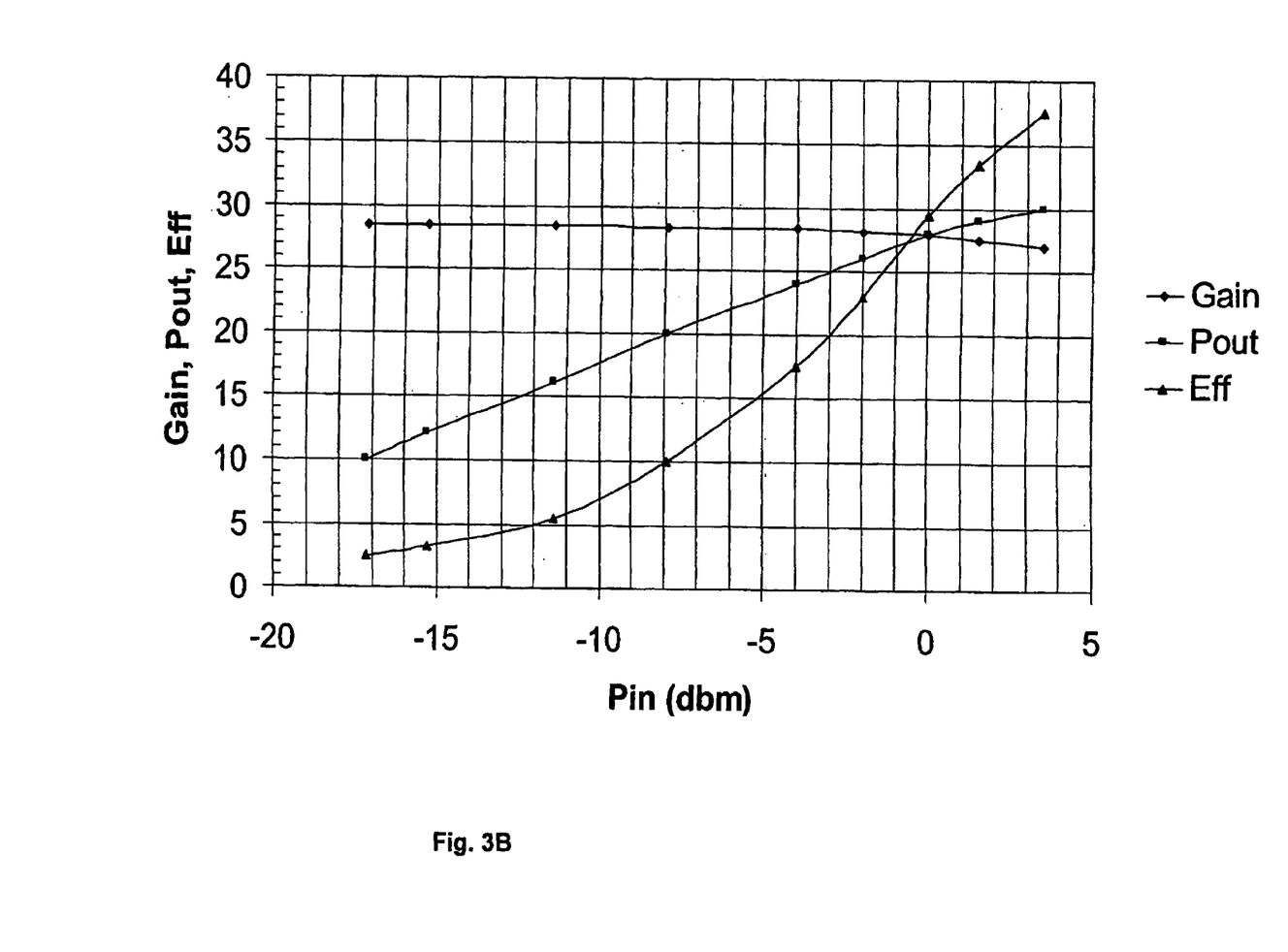
FIG. 3B shows the output power $P_{OUT}$, Gain, and efficiency characteristics of a temperature compensated power amplifier device constructed according to the principles of the present invention, and contrasted with uncompensated devices.
Figure 4:
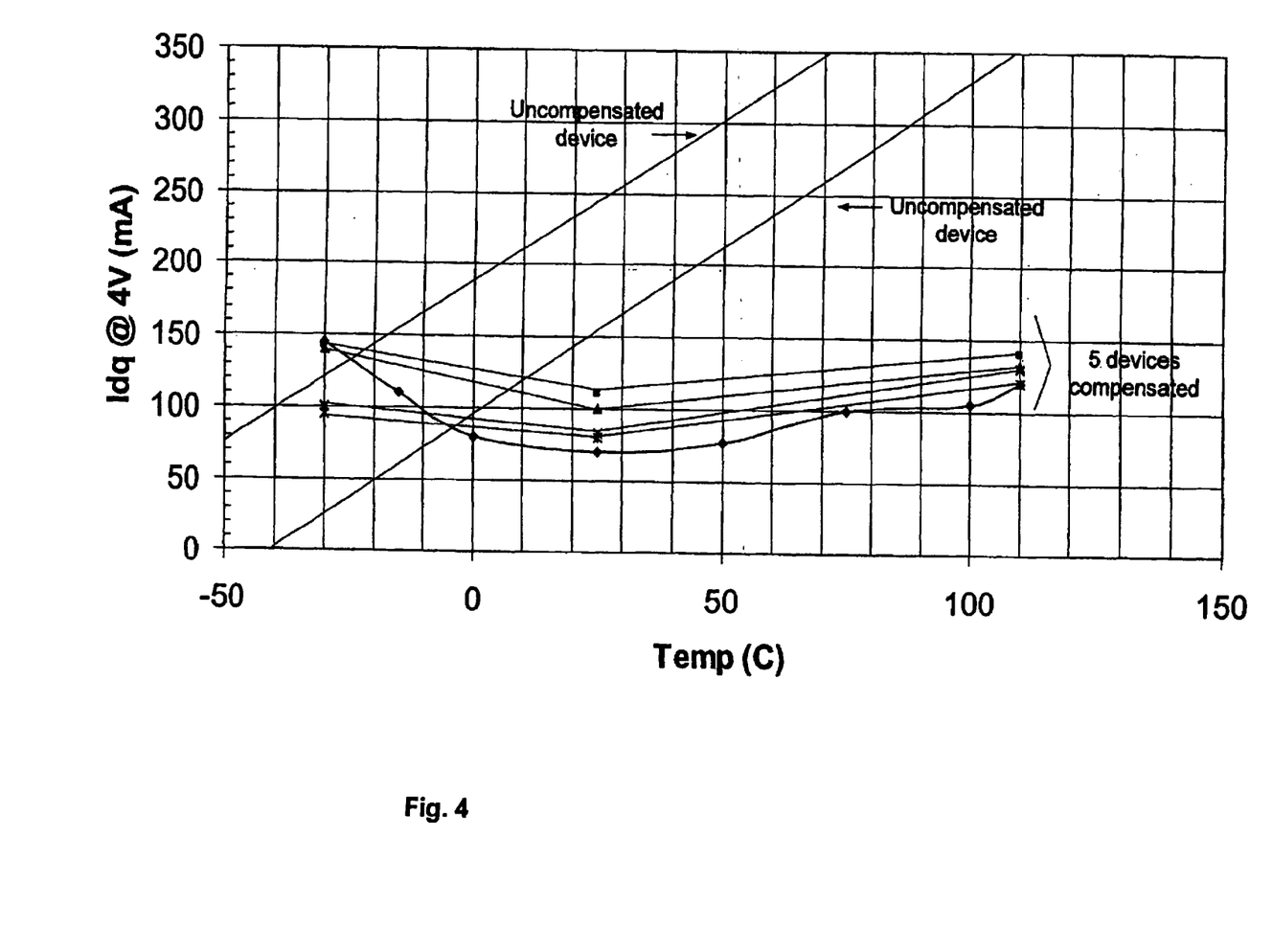
FIG. 4 is a characteristic of five devices in accordance with the present invention wherein the bias current $I_{dq}$ is shown as temperature varies between $-30°$ C. and $+110°$ C.

As temperature increases, the voltage drop across the pair of diodes decreases causing the transistor Q7 to draw more current. This creates a voltage drop in $V_{refB}$ which is level shifted to Vg causing it also to become more negative, in turn causing the three stages of the amplifier to draw less current and maintain the decreased current level. An opposite result occurs when the temperature decreases. FIG. 3B shows the output power $P_{OUT}$, Gain, and efficiency characteristics of a temperature-compensated power amplifier constructed according to the principles of the present invention. FIG. 4 illustrates the variation of the bias current $I_{dq}$ versus temperature for five devices in accordance with the present invention, wherein the bias current $I_{dq}$ is shown as temperature varies between −30° C. and +110° C. The figure illustrates that the amplifier's bias point can be controlled using the temperature compensation circuit described above. Also shown for comparison are plots for two uncompensated circuits in which the bias point changes linearly with temperature.

The embodiments described herein are merely illustrative and not intended to limit the scope of the invention. One skilled in the art may make various changes, rearrangements and modifications without substantially departing from the principles of the invention. For example, a bias adjustment in accordance with the present invention can be achieved by detecting increases or decreases in distortion of the output signal (e.g., by comparing the input signal to the output signal). To reduce AM—AM distortion of a non-constant envelope signal, the instantaneous output AC swing can be detected and the bias point can be dynamically adjusted in order to minimize gain compression (i.e., change from Class B mode to Class AB mode). This would result in reduced AM—AM distortion during the high instantaneous voltage peaks. Alternatively, in another example the output AC voltage swing can be detected to monitor substantial changes in output loading conditions. Variations in load conditions can result in substantial increases in peak output AC voltage swings that can be excessive and cause permanent damage to the output stage. These peak AC swings can be detected and an appropriate bias point change can be applied in order to either turn off the power amplifier or substantially reduce the overall power amplifier gain (i.e., change from Class AB mode to Class B mode).

Also, certain portions of the described circuitry can be modified to include discrete components, whereas the remaining portion can be etched into a monolithic integrated circuit. Additionally, the materials described herein may be changed. Accordingly, all such deviations and departures should be interpreted to be within the spirit and scope of the following claims.

What is claimed is:

1. A dynamic bias adjustor, comprising:
   a signal detector for determining the drive level of an amplifying device, and
   a bias output circuit connected to said signal detector and configured to operate the amplifying device in a Class B mode or substantially close to a Class B mode during low drive level conditions, and in a Class AB mode during high drive level conditions.

2. The dynamic bias adjustor as in claim 1, further comprising a temperature compensation circuit to stabilize the bias point of the amplifying device over a temperature range.

3. The dynamic bias adjustor as in claim 2, wherein the temperature range is between −30° C. and +110° C.

4. The dynamic bias adjustor of claim 1, wherein said amplifying device comprises
   a pre-amplifier stage, a drive stage, and an output stage, and
   wherein the signal detector is connected to the output of said drive stage.

5. The dynamic bias adjustor of claim 4, wherein said dynamic bias adjustor biases at least one of said pre-amplifier stage, said drive stage, and said output stage to operate in a Class B mode or substantially close to a Class B mode, when the signal level detected by said signal detector is below a predetermined level.

6. The dynamic bias adjustor of claim 5, wherein said dynamic bias adjustor biases at least one of said pre-amplifier stage, said drive stage, and said output stage to operate in a Class AB mode, when the signal level detected by said signal detector is above a predetermined level.

7. The dynamic bias adjustor of claim 1, further comprising:
   a differential amplifier, connected to said signal detector, and
   a source follower, connected between said differential amplifier and an input of said amplifying device;
   whereby said signal detector produces a signal that is proportional to the output of said amplifying device, said differential amplifier amplifies said signal, and the output of said source follower adjusts the operating point of said amplifying device according to the amplified signal.

8. The dynamic bias adjustor of claim 2, wherein said temperature compensation circuit comprises:
- a transistor having a control input and two outputs, wherein one of said outputs is connected to ground and the other is connected to said bias adjustment circuit; and
- at least one solid-state element having an impedance that varies according to its temperature, connected at one end to the control input of said transistor and at another end to ground;
- a reference resistor connected at one end to the junction of the solid-state element and the control input of said transistor and capable of receiving at another end a negative supply voltage;
- wherein said transistor outputs a temperature-dependent signal to said dynamic bias adjustment circuit that is proportional to the temperature of said solid-state element, and said dynamic bias adjustment circuit alters the operating point of said amplifying device to compensate for changes in the temperature-dependent signal output from said transistor.

9. A method of designing an efficiently biased amplifying circuit comprising a pre-amplifier stage, a driver stage and an output stage, the method comprising the steps of:
- providing a dynamic bias adjuster for detecting an alternating current voltage and generating a direct current output voltage having a value proportional to the alternating current voltage peak level;
- connecting the dynamic bias adjuster to the driver output voltage; and
- connecting the output voltage of the dynamic bias adjustor to bias the stages of the amplifying circuit whereby at least one of the stages of the amplifying circuit operates in a Class B mode or substantially close to a Class B when the driver output is at or below a predetermined level.

10. The method of claim 9, whereby at least one of the stages of the amplifying circuit operates in a Class AB mode when the driver output is at or above a predetermined level.

11. The method of claim 9, further comprising the step of adding a temperature stabilizing circuit which adjusts the bias point of at least one of the stages to account for changes in temperature.

12. A method of implementing a biasing scheme for an amplifying device, comprising the steps of:
- monitoring a signal level at an output of the amplifying device;
- producing a first signal proportional to the signal level; and
- dynamically biasing, as a function of the first signal, the amplifying device to operate in a Class B mode or substantially close to a Class B mode when the signal level is low, and in a Class AB mode when the signal is high.

13. The method of claim 12, further comprising the steps of:
- producing a second signal proportional to the temperature of the amplifying device; and
- dynamically biasing, as a function of the second signal, the amplifying device so that its operating point is substantially stable over a temperature range.

14. The method of claim 13, wherein the temperature range is between −30° C. and +110° C.

15. The method of claim 12, further comprising the steps of:
- amplifying the first signal,
- level-shifting the first signal, and
- using the level-shifted signal to alter the operating point of the amplifying device.

16. The method of claim 13, wherein the steps of producing a second signal comprises the steps of:
- establishing a current-flow through a solid-state element having an impedance that varies according to its temperature, thereby creating a temperature-dependent voltage signal;
- applying the temperature-dependent voltage signal to a transistor, whereby the output signal of the transistor also varies according to temperature; and
- level-shifting the second signal.

* * * * *

UNITED STATES PATENT AND TRADEMARK OFFICE
CERTIFICATE OF CORRECTION

PATENT NO. : 6,937,102 B2
APPLICATION NO. : 10/208636
DATED : August 30, 2005
INVENTOR(S) : Lopez et al.

Page 1 of 1

It is certified that error appears in the above-identified patent and that said Letters Patent is hereby corrected as shown below:

At Column 6, lines 25 – 26 of Claim 1 thereof, please replace "an amplifying device" with --a circuit--;

At Column 6, line 28 of Claim 1 thereof, please replace "amplifying device" with --circuit--;

At Column 6, line 34 of Claim 2 thereof, please replace "amplifying device" with --circuit--;

At Column 6, line 38 of Claim 4 thereof, please insert after "said" --circuit is an--;

At Column 6, line 39, of Claim 4 thereof, please replace "comprises" with --coupled to the bias adjustor comprising--

At Column 8, line 7 of Claim 12 thereof, please insert after "proportional to" --a distortion in--;

At Column 8, line 11 of Claim 12 thereof, please insert after "Class B mode when the" --first--

Signed and Sealed this

Twentieth Day of March, 2007

JON W. DUDAS
*Director of the United States Patent and Trademark Office*